(12) United States Patent
Kawashima

(10) Patent No.: US 6,915,548 B2
(45) Date of Patent: Jul. 12, 2005

(54) METHOD FOR MANUFACTURING QUARTZ CRYSTAL TUNING FORK RESONATOR, QUARTZ CRYSTAL UNIT HAVING QUARTZ CRYSTAL TUNING FORK RESONATOR, AND QUARTZ CRYSTAL OSCILLATOR HAVING QUARTZ CRYSTAL UNIT

(75) Inventor: Hirofumi Kawashima, Tokyo (JP)

(73) Assignee: Piedek Technical Laboratory, Tokyo (JP)

( * ) Notice: Subject to any disclaimer, the term of this patent is extended or adjusted under 35 U.S.C. 154(b) by 161 days.

(21) Appl. No.: 10/358,821

(22) Filed: Feb. 5, 2003

(65) Prior Publication Data

US 2003/0169118 A1 Sep. 11, 2003

(30) Foreign Application Priority Data

Mar. 6, 2002 (JP) ........................................ 2002-060827
Jan. 14, 2003 (JP) ........................................ 2003-040391

(51) Int. Cl.$^7$ ............................................. H01L 41/10
(52) U.S. Cl. ..................................... 29/25.35; 310/370
(58) Field of Search ................................ 331/158, 116 R, 331/156, 107 A; 310/370, 320, 312; 29/25.35

(56) References Cited

U.S. PATENT DOCUMENTS 3,576,453 A * 4/1971 Mason ........................ 310/320
4,178,566 A * 12/1979 Kawashima ................. 331/156
4,205,248 A * 5/1980 Negita ......................... 310/370
4,384,232 A * 5/1983 Debely ......................... 310/370
2002/0125794 A1 * 9/2002 Tanaya et al. ............. 310/323.06

FOREIGN PATENT DOCUMENTS

| JP | 56065517 | 6/1981 |
| JP | 00044092 | 7/2000 |
| JP | 00223992 | 8/2000 |

* cited by examiner

Primary Examiner—Robert Pascal
Assistant Examiner—Joseph Chang
(74) Attorney, Agent, or Firm—Adams & Wilks

(57) ABSTRACT

In method for manufacturing a quartz crystal tuning fork resonator capable of vibrating in a flexural mode, a quartz crystal wafer is etched in a first etching process to form a quartz crystal tuning fork base and quartz crystal tuning fork tines connected to the quartz crystal tuning fork base. The quartz crystal wafer is etched in a second etching process different from the first etching process to form a groove having stepped portions in at least one of opposite main surfaces of each of the quartz crystal tuning fork tines. First electrodes having a first electrical polarity are disposed on the stepped portions of the grooves of respective ones of the quartz crystal tuning fork tines. Second electrodes having a second electrical polarity opposite to the first electrical polarity are disposed on side surfaces of respective ones of the quartz crystal tuning fork tines.

41 Claims, 11 Drawing Sheets

METHOD FOR MANUFACTURING QUARTZ CRYSTAL TUNING FORK RESONATOR, QUARTZ CRYSTAL UNIT HAVING QUARTZ CRYSTAL TUNING FORK RESONATOR, AND QUARTZ CRYSTAL OSCILLATOR HAVING QUARTZ CRYSTAL UNIT

BACKGROUND OF THE INVENTION

Field of the Invention

The present invention relates to a quartz crystal oscillator comprising a quartz crystal tuning fork resonator, capable of vibrating in a flexural mode and having a high frequency stability.

BACKGROUND INFORMATION

Quartz crystal oscillators with a quartz crystal tuning fork resonator, which is capable of vibrating in a flexural mode, are widely used as a time standard in consumer products, wearable time-keeping equipment and communication equipment (such as cellular phones, wristwatches and pagers). Recently, because of high stability for frequency, miniaturization and the light weight nature of these products, the need for a smaller quartz crystal oscillator with a smaller quartz crystal tuning fork resonator, capable of vibrating in a flexural mode and having a high frequency stability, a small series resistance and a high quality factor has arisen.

Heretofore, however, it has been impossible to obtain a quartz crystal oscillator with a conventional miniaturized quartz crystal tuning fork resonator, capable of vibrating in a flexural mode, and having a high frequency stability, a small series resistance and a high quality factor. When miniaturized, the conventional quartz crystal tuning fork resonator capable of vibrating in a flexural mode, as shown in FIG. 10(which has electrodes on the obverse faces 203, 207, reverse faces 204, 208 and the four sides 205, 206, 209, 210 of each tuning fork tine, as also shown in FIG. 11—a cross-sectional view of tuning fork tines of FIG. 10), it has a smaller electromechanical transformation efficiency because the resonator shape and the electrode construction provide a small electric field (i.e. Ex becomes small), as a result of which the resonator has a low frequency stability, a large series resistance and a reduced quality factor. In FIG. 10, a conventional tuning fork resonator 200 is shown with tuning fork tines 201, 202 and a tuning fork base 230.

Moreover, for example, Japanese Patent Nos. P56-65517 and P2000-223992A and International Patent No. WO 00/44092 were published and teach grooves and electrodes constructed at tuning fork tines of a flexural mode, tuning fork, quartz crystal resonator. However, they teach nothing about a quartz crystal oscillator of the present invention having novel shape, novel electrode construction and figure of merit M for a quartz crystal tuning fork resonator, capable of vibrating in a flexural mode and about a relationship of an amplification circuit and a feedback circuit which construct a quartz crystal oscillating circuit, and also, teach nothing about a method for manufacturing a quartz crystal oscillator of the present invention and a quartz crystal unit which is used in the quartz crystal oscillator of the present invention.

In addition, for example, there been has a big problem in the conventional quartz crystal oscillator with the conventional quartz crystal tuning fork resonator, such that a fundamental mode vibration of the resonator jumps to a second overtone mode vibration by shock or vibration.

It is, therefore, a general object of the present invention to provide embodiments of a quartz crystal oscillator comprising a quartz crystal oscillating circuit with a flexural mode, quartz crystal tuning fork resonator, capable of vibrating in a fundamental mode, and having a high frequency stability, a small series resistance and a high quality factor, which overcome or at least mitigate one or more of the above problems.

SUMMARY OF THE INVENTION

The present invention relates to a quartz crystal oscillator comprising a quartz crystal oscillating circuit having an amplification circuit and a feedback circuit, and in particular, relates to a quartz crystal oscillator having a flexural mode, quartz crystal tuning fork resonator capable of vibrating in a fundamental mode and having an output signal of a high frequency stability for the fundamental mode vibration of the resonator, and also to a quartz crystal oscillator having a suppressed second overtone mode vibration of the flexural mode, quartz crystal tuning fork resonator. The oscillator is, therefore, available for consumer products and communication equipment and so forth requiring miniaturized, high time accuracy, shock proof and low priced quartz crystal oscillators.

It is an object of the present invention to provide a quartz crystal oscillator with a miniature quartz crystal tuning fork resonator, capable of vibrating in a flexural mode, and having a high frequency stability, a small series resistance $R_1$ and a high quality factor $Q_1$.

It is an another object of the present invention to provide a quartz crystal oscillator with a flexural mode, quartz crystal tuning fork resonator, capable of vibrating in a fundamental mode vibration, and having a high frequency stability which gives a high time accuracy.

It is a further object of the present invention to provide a method for manufacturing a quartz crystal oscillator of the present invention and a quartz crystal unit which is used in the quartz crystal oscillator.

According to one aspect of the present invention, there is provided a quartz crystal oscillator comprising: a quartz crystal oscillating circuit comprising; an amplification circuit comprising an amplifier at least, and a feedback circuit comprising a flexural mode, quartz crystal tuning fork resonator and capacitors at least. Especially, the quartz crystal tuning fork resonator is capable of vibrating in a fundamental mode and comprises; tuning fork tines each of which has a length, a width and a thickness and the length greater than the width and the thickness, and a tuning fork base, said tuning fork tines and said tuning fork base that are formed integrally, grooves provided at said tuning fork tines, and electrodes disposed opposite each other inside the grooves and on sides of said tuning fork tines so that the electrodes disposed opposite each other are of opposite electrical polarity.

According to a second aspect of the present invention there is provided a method for manufacturing a quartz crystal oscillator comprising: a quartz crystal oscillating circuit comprising; an amplification circuit comprising an amplifier at least, and a feedback circuit comprising a flexural mode, quartz crystal tuning fork resonator and capacitors at least. Especially, the quartz crystal tuning fork resonator comprises tuning fork tines and a tuning fork base, and each tine has grooves.

Embodiments of the present invention use grooves and an electrode construction arranged on tuning fork tines and/or a tuning fork base of a flexural mode, quartz crystal tuning fork resonator.

Preferably, the resonator has grooves including the central line of the central portions for each tuning fork tine and the electrodes disposed inside the grooves and disposed on the sides of each tuning fork tine, and the grooves and the electrodes are constructed so that figure of merit of a fundamental mode vibration is larger than that of a second overtone mode vibration.

Preferably, the quartz crystal oscillator is constructed so that a ratio of an amplification rate $\alpha_1$ of the fundamental mode vibration and an amplification rate $\alpha_2$ of the second overtone mode vibration of said amplification circuit is larger than that of a feedback rate $\beta_2$ of the second overtone mode vibration and a feedback rate $\beta_1$ of the fundamental mode vibration of said feedback circuit, and a product of the amplification rate $\alpha_1$ and the feedback rate $\beta_1$ of the fundamental mode vibration is larger than 1.

Preferably, the quartz crystal oscillator is constructed so that a ratio of an absolute value of negative resistance, $|-RL_1|$ of the fundamental mode vibration of said amplification circuit and series resistance $R_1$ of the fundamental mode vibration is larger than that of an absolute value of negative resistance, $|-RL_2|$ of the second overtone mode vibration of said amplification circuit and series resistance $R_2$ of the second overtone mode vibration.

The present invention will be more fully understood by referring to the following detailed specification and claims taken in connection with the appended drawings.

DETAILED DESCRIPTION OF THE PREFERRED EMBODIMENTS

Figure 1:
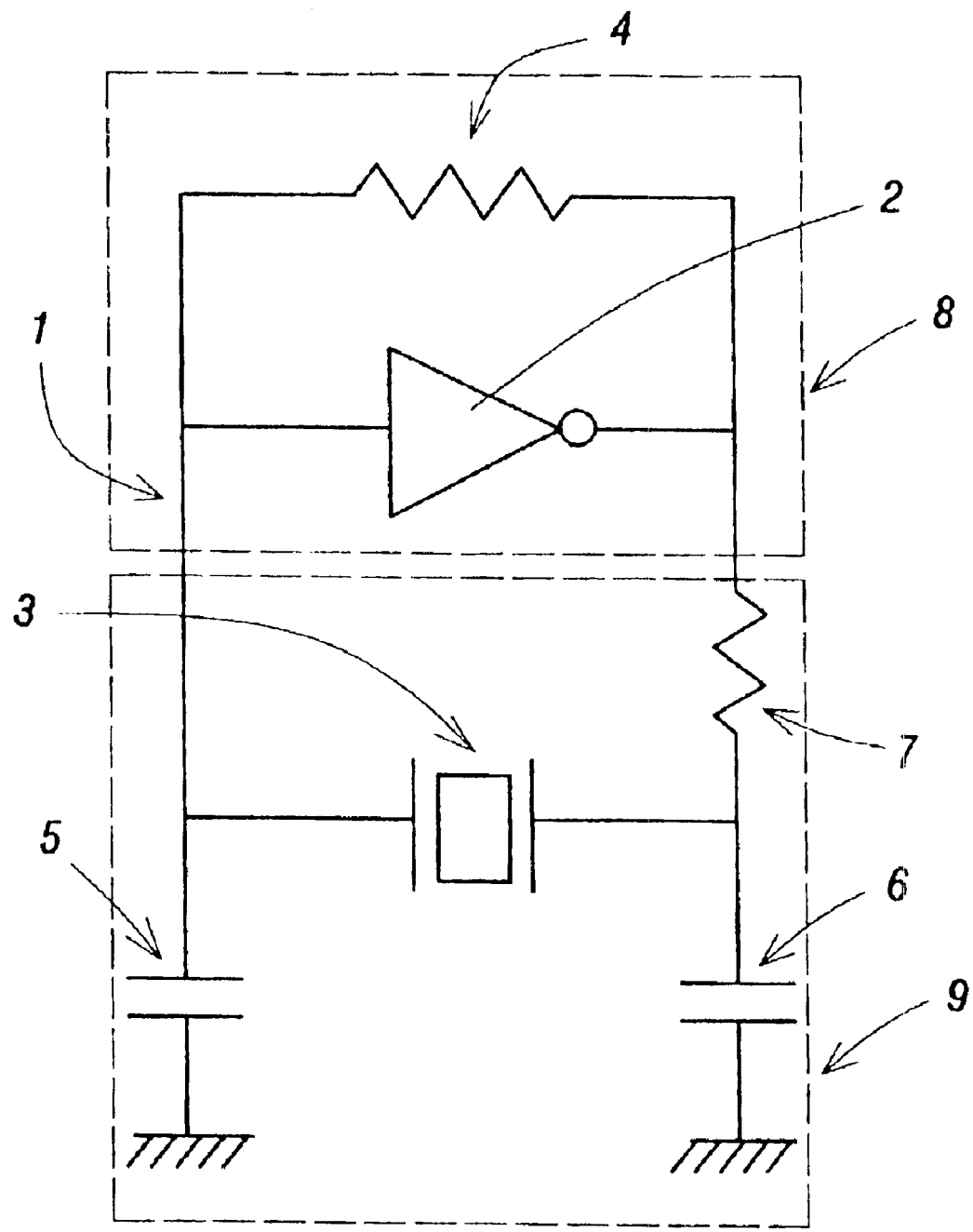
FIG. 1 shows a diagram of an embodiment of a quartz crystal oscillating circuit which constructs a quartz crystal oscillator of the present invention.

Referring now to the drawings, the embodiments of the present invention will be described in more detail.

FIG. 1 shows a diagram of an embodiment of a quartz crystal oscillating circuit constructing a quartz crystal oscillator of the present invention. The quartz crystal oscillating circuit 1 comprises an amplifier (CMOS Inverter) 2, a feedback resistor 4, drain resistor 7, capacitors 5, 6 and a flexural mode, quartz crystal tuning fork resonator 3. Namely, the quartz crystal oscillating circuit 1 comprises an amplification circuit 8 having the amplifier 2 and the feedback resistor 4, and a feedback circuit 9 having the drain resistor 7, the capacitors 5, 6 and the flexural mode quartz crystal resonator 3. In addition, an output signal of the quartz crystal oscillating circuit 1 comprising the flexural mode, quartz crystal tuning fork resonator 3, capable of vibrating in a fundamental mode, is outputted through a buffer circuit (not shown in FIG. 1) from an output side of the amplifier (CMOS Inverter).

In detail, a frequency of the fundamental mode vibration is outputted through a buffer circuit as an output signal. According to the present invention, the frequency of the fundamental mode vibration is within a range of 10 kHz to 200 kHz. Also, the present invention includes a divided: frequency of the output signal with the frequency of the fundamental mode vibration by a divided circuit. In more detail, the quartz crystal oscillator in this embodiment comprises the quartz crystal oscillating circuit and the buffer circuit, in other words, the quartz crystal oscillating circuit comprises the amplification circuit and the feedback circuit, and the amplification circuit comprises the amplifier at least and the feedback circuit comprises the flexural mode, quartz crystal tuning fork resonator and the capacitors at least. Also, flexural mode, quartz crystal tuning fork resonators which are used in a quartz crystal oscillator of the present invention will be described in FIG. 3–FIG. 6 in detail.

Figure 2:
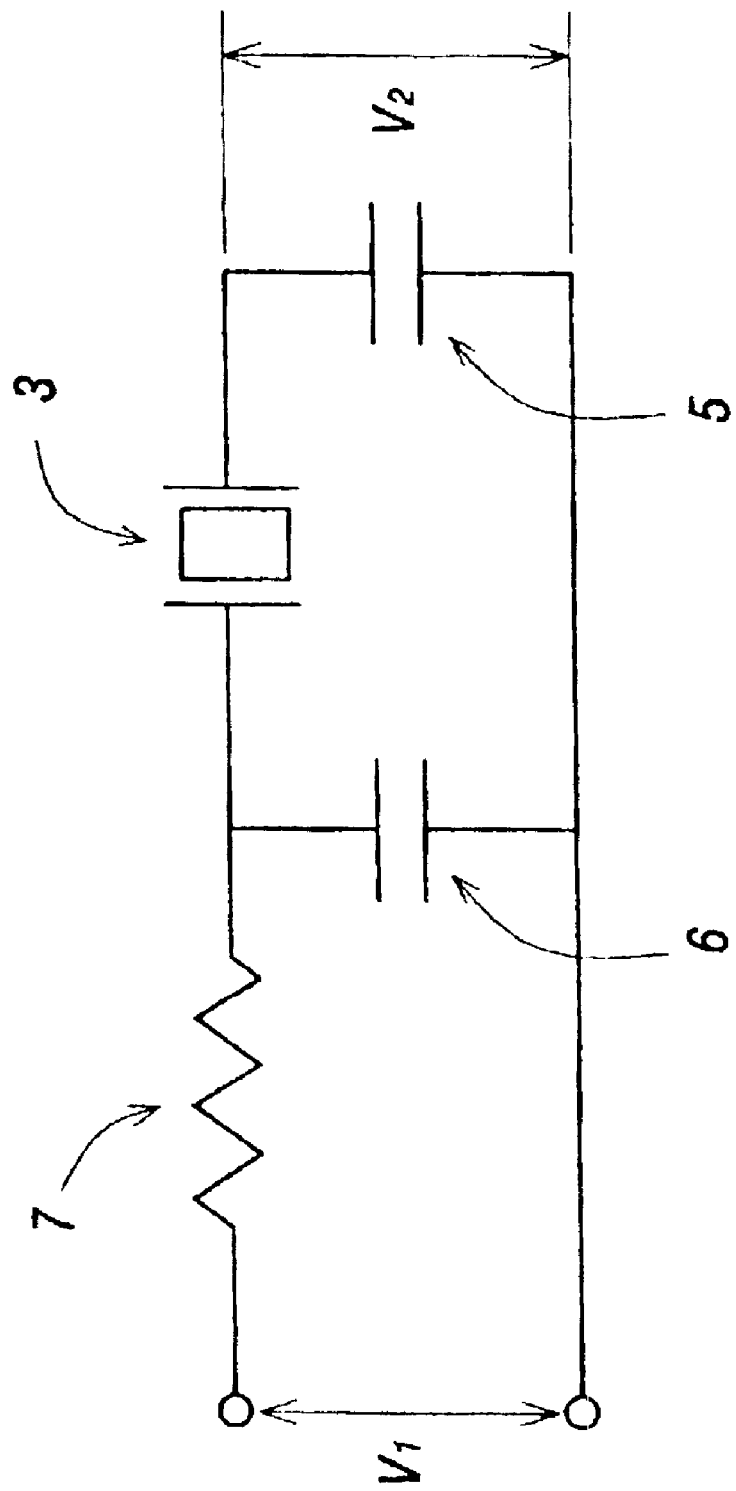
FIG. 2 shows a diagram of the feedback circuit of FIG. 1.

FIG. 2 shows a diagram of the feedback circuit of FIG. 1. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i = |V_2|_i/|V_1|_i$, where i shows vibration order, for example, when i=1 and 2, they are for fundamental mode vibration and second overtone mode vibration, namely, when i=n, it is for $n^{th}$ overtone mode vibration.

In addition, load capacitance $C_L$ is given by $C_L = C_g C_d/(C_g + C_d)$, and when $C_g = C_d = C_{gd}$ and $Rd \gg R_{ei}$, the feedback rate $\beta_i$ is given by $\beta_i = 1/(1 + kC_L^2)$, where k is expressed by a function of $\omega_i$, $R_d$ and $R_{ei}$. Also, $R_{ei}$ is approximately equal to series resistance $R_i$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when CL has a small value, an oscillation of the overtone mode occurs very easily, instead of that of the fundamental mode. This is the reason why a maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a high frequency stability (high time accuracy) of an output signal, and having reduced electric current consumption, in this embodiment, load capacitance $C_L$ is less than 10 pF to reduce electric current consumption. To get much reduced electric current consumption, $C_L$ is preferably less than 8 pF because electric current consumption is proportional to $C_L$. Here, CL does not include stray capacity of an oscillating circuit. Actually, there exists the stray capacity by constructing the oscillating circuit. Therefore, in this embodiment, load capacitance $C_L$ including the stray capacity by constructing the circuit is less than 18 pF.

In addition, in order to suppress a second overtone mode vibration and to obtain a quartz crystal oscillator having an output signal of a frequency of a fundamental mode vibration, the quartz crystal oscillator in this embodiment is constructed so that it satisfies a relationship of $\alpha_1/\alpha_2 > \beta_2/\beta_1$ and $\alpha_1\beta_1 > 1$, where $\alpha_1$ and $\alpha_2$ are a amplification rate of the fundamental mode vibration and the second overtone mode vibration of an amplification circuit, and $\beta_1$ and $\beta_2$ are a feedback rate of the fundamental mode vibration and the second overtone mode vibration of a feedback circuit.

In other words, the quartz crystal oscillator is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and a product of the amplification rate $\alpha_1$ and the feedback rate $\beta_1$ of the fundamental mode vibration is larger than 1. By constructing the oscillator like this, it can be provided with reduced electric current consumption and the output signal of the frequency of the fundamental mode vibration. In addition, a description of the high frequency stability will be performed later.

Also, characteristics of the amplifier of the amplification circuit constructing the quartz crystal oscillating circuit of this embodiment can be expressed by negative resistance–$RL_i$. For example, when i=1, negative resistance $-RL_1$ is for a fundamental mode vibration and when i=2, negative resistance $-RL_2$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-RL_1|/R_1 > |-RL_2|/R_2$. By constructing the oscillating circuit like this, an oscillation of the second overtone mode can be suppressed, as a result of which an output signal of a frequency of the fundamental mode vibration can be provided because an oscillation of the fundamental mode generates easily in the oscillating circuit.

Figure 3:
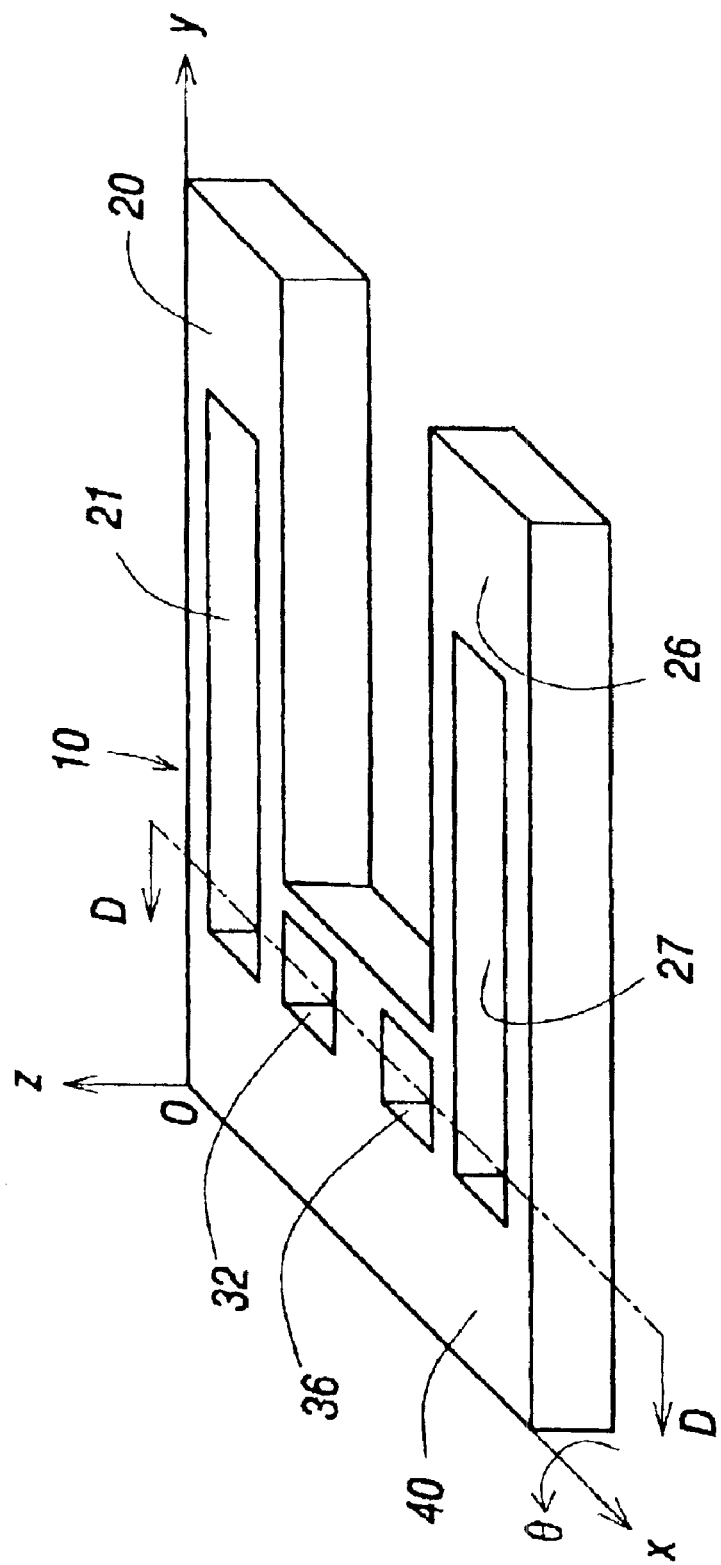
FIG. 3 shows a general view of a flexural mode, quartz crystal tuning fork resonator which constructs a quartz crystal oscillator of the first embodiment of the present invention.

FIG. 3 shows a general view of a flexural mode, quartz crystal tuning fork resonator 10 which constructs a quartz crystal oscillator of the first embodiment of the present invention and its coordinate system o-xyz. A cut angle θ, which has a typical value of 0° to 10°, is rotated from a Z-plate perpendicular to the z axis about the x axis. The quartz crystal resonator 10 comprises two tuning fork tines 20 and 26 and a tuning fork base 40. The tines 20 and 26 have grooves 21 and 27 respectively, with the grooves 21 and 27 extending into the base 40. In addition, the base 40 has the additional grooves 32 and 36.

Figure 4:
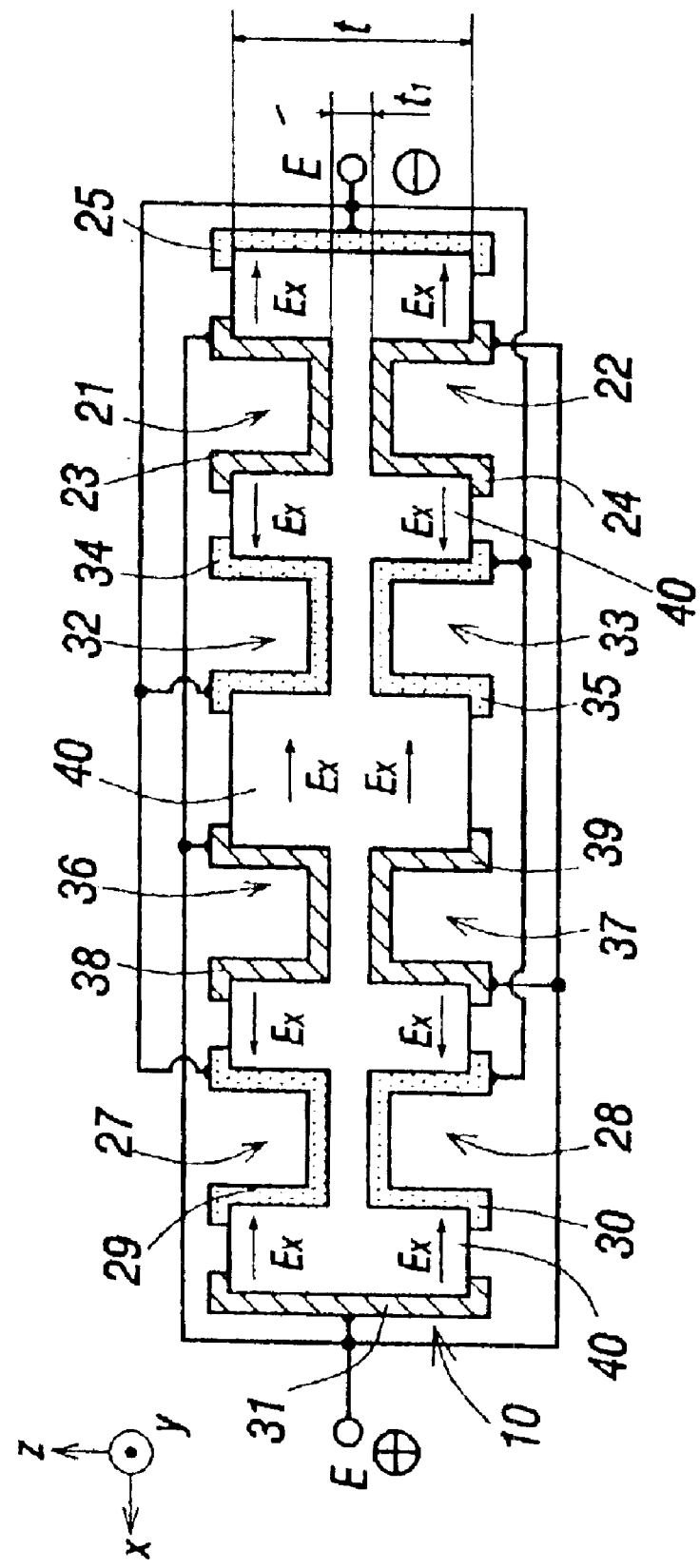
FIG. 4 shows a D—D' cross-sectional view of the tuning fork base of FIG. 3, and illustrating electrode construction.

FIG. 4 shows a D—D' cross-sectional view of the tuning fork base 40 for the quartz crystal resonator 10 of FIG. 3. In FIG. 4, the shape of the electrode construction within the base 40 for the quartz crystal resonator of FIG. 3 is described in detail. The section of the base 40 which couples to the tine 20 has the grooves 21 and 22 cut into the obverse and reverse faces of the base 40. Also, the section of the base 40 which couples to the tine 26 has the grooves 27 and 28 cut into the obverse and reverse faces of the base 40. In addition to these grooves, the base 40 has the grooves 32 and 36 cut between the grooves 21 and 27, and also, the base 40 has the grooves 33 and 37 cut between the grooves 22 and 28.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others. Two electrode terminals E—E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

In addition, the resonator has a thickness t of the tuning fork tines or the tuning fork tines and the tuning fork base, and a groove thickness $t_1$. It is needless to say that the electrodes are disposed inside the grooves and on the sides of the tuning fork tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tuning fork tines so that the electrodes disposed opposite each other are of opposite electrical polarity.

Now, when a direct voltage is applied between the electrode terminals E—E' (E terminal: plus, E' terminal: minus), an electric field Ex occurs in the arrow direction as shown in FIG. 4. As the electric field Ex occurs perpendicular to the electrodes disposed on the tuning fork base, the electric field Ex has a very large value and a large distortion occurs at the tuning fork base, so that a flexural mode, quartz crystal tuning fork resonator is obtained with a small series resistance, $R_1$ and a high quality factor $Q_1$, even if it is miniaturized.

Figure 5:
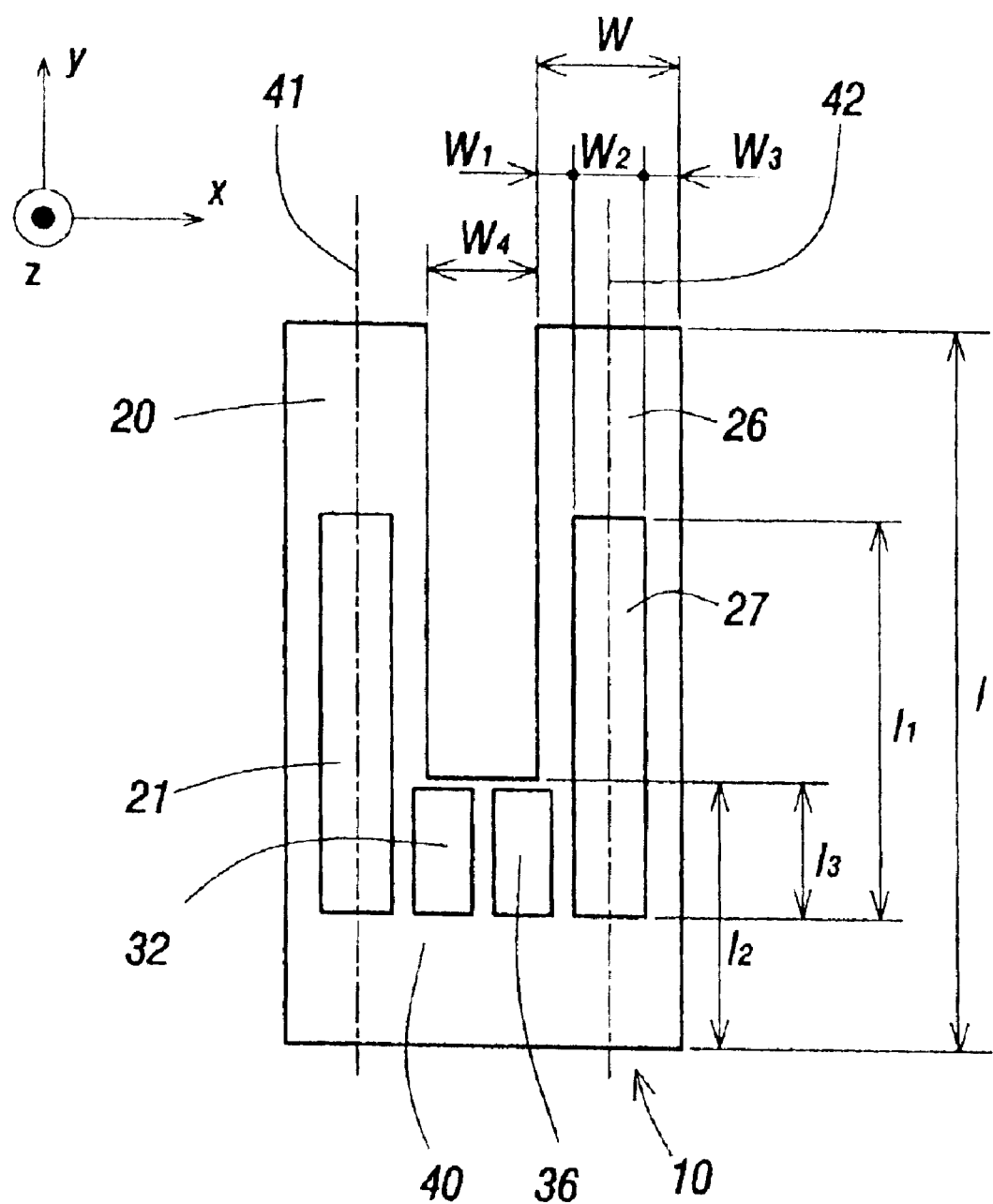
FIG. 5 shows a plan view of a quartz crystal tuning fork resonator of FIG. 3.

FIG. 5 shows a plan view of a quartz crystal tuning fork resonator 10 of FIG. 3. In FIG. 5, the construction and the dimension of grooves 21, 27, 32 and 36 are described in detail. The groove 21 is constructed to include a portion of the central line 41 of the tine 20, the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the tines can vibrate in a flexural mode very easily. As a result of which flexural mode, tuning fork, quartz crystal resonator capable of vibrating in a fundamental mode can be obtained with a small series resistance $R_1$ and a high quality factor $Q_1$.

In more detail, when part widths $W_1$, $W_3$ and groove width $W_2$ are taken, the tine width W of the tines 20 and 26 has a relationship of $W=W_1+W_2+W_3$, and a part or all of at least one of the grooves is constructed so that $W_1 \geqq W_3$ or $W_1 < W_3$. In addition, the groove width $W_2$ is constructed so that $W_2 \geqq W_1$, $W_3$. In this embodiment, also, the grooves are constructed at the tuning fork tines so that a ratio($W_2/W$) of the groove width $W_2$ and the tine width W is larger than 0.35 and less than 1, and a ratio($t_1/t$) of the groove thickness $t_1$ and the thickness t of the tuning fork tines (tine thickness t) is less than 0.79, preferably, within a range of 0.01 to 0.79 to obtain very large moment of inertia of the tuning fork tines. That is to say, the flexural mode, quartz crystal tuning fork resonator, capable of vibrating in the fundamental mode, and having a high frequency stability can be provided with a small series resistance $R_1$, a high quality factor $Q_1$ and a small capacitance ratio $r_1$ because electromechanical transformation efficiency of the resonator becomes large markedly.

Likewise, length $l_1$ of the grooves 21 and 27 of the tines 20 and 26 extends into the base 40 in this embodiment (which has a dimension of the length $l_2$ and the length $l_3$ of the grooves). Therefore, groove length and length of the tuning fork tines are given by $(l_1-l_3)$ and $(l-l_2)$, respectively, and a ratio of $(l_1-l_3)$ and $(l-l_2)$ is within a range of 0.4 to 0.8 to get a flexural mode, quartz crystal tuning fork resonator with series resistance $R_1$ of a fundamental mode vibration smaller than series resistance $R_2$ of a second overtone mode vibration Furthermore, the total length l is determined by the frequency requirement and the size of the housing case. At the same time, to get a flexural mode, quartz crystal tuning fork resonator capable of vibrating easily in a fundamental mode with suppression of the second overtone mode vibration which is unwanted mode vibration, there is a close relationship between the groove length $l_1$ and the total length l. Namely, a ratio($l_1/l$) of the groove length $l_1$ and the total length l is within a range of 0.2 to 0.78 because the quantity of charges which generate within the grooves and on the sides of the tuning fork tines or the tuning fork tines and the tuning fork base can be controlled by the ratio, as a result of which the second overtone mode vibration, which is unwanted mode vibration, can be suppressed substantially, and simultaneously, a frequency stability of the fundamental mode vibration gets high. Therefore, the flexural mode, quartz crystal tuning fork resonator, capable of vibrating easily in the fundamental mode and having the high frequency stability can be provided.

In more detail, series resistance $R_1$ of the fundamental mode vibration becomes smaller than series resistance $R_2$ of the second overtone mode vibration. Namely, $R_1 < R_2$, preferably, $R_1 < 0.86 R_2$, therefore, a quartz crystal oscillator (oscillator circuit) comprising an amplifier (CMOS inverter), capacitors, resistors(resistance elements) and a quartz crystal unit with the quartz crystal tuning fork resonator of this embodiment can be obtained, which is capable of vibrating in the fundamental mode very easily. In addition, in this embodiment the grooves 21 and 27 of the tines 20 and 26 extend into the base 40 in series, but embodiment of the present invention includes a plurality of grooves divided into the length direction of the tuning fork tines. In addition, the grooves may be constructed only at the tuning fork tines($l_3=0$).

In this embodiment, the groove length $l_1$ corresponds to electrode length disposed inside the grooves, though the electrode is not shown in FIG. 5, but, when the electrode length is less than the groove length, the length $l_1$ is of the electrode length. Namely, the ratio($l_1/l$) in this case is expressed by a ratio of electrode length $l_1$ of the grooves and the total length l. In order to achieve the above-mentioned object, it may be satisfied with at least one groove with the ratio constructed at the obverse and reverse faces of each tuning fork tine. As a result of which the flexural mode, quartz crystal tuning fork resonator, capable of vibrating very easily in the fundamental mode and having the high frequency stability can be realized. Also, a fork portion of this embodiment has a rectangular shape, but this invention is not limited to this, for example, the fork portion may have a U shape.

In addition, a space of between the tuning fork tines is given by $W_4$, and in this embodiment, the space $W_4$ and the groove width $W_2$ are constructed so that $W_4 \geqq W_2$, and more, the space $W_4$ is within a range of 0.05 mm to 0.35 mm and the width $W_2$ is within a range of 0.03 mm to 0.12 mm because it is easy to form a tuning fork shape and grooves of the tuning fork tines separately by a photo-lithographic process and an etching process, consequently, a frequency stability for a fundamental mode vibration gets higher than that for a second overtone mode vibration. In this embodiment, a quartz crystal wafer with the thickness t of 0.05 mm to 0.12 mm is used. But, it is possible to use the wafer thicker than 0.12 mm.

In more detail, to obtain a flexural mode, quartz crystal tuning fork resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ plays an important role. Namely, the figure of merit $M_i$ that expresses inductive characteristics, electromechanical transformation efficiency and a quality factor of a flexural mode, quartz crystal tuning fork resonator, is defined by a ratio ($Q_i/r_i$) of a quality factor $Q_i$ and capacitance ratio $r_i$, namely, $M_i$ is given by $M_i=Q_i/r_i$, where i shows vibration order of a quartz crystal tuning fork resonator, and for example, when i=1 and 2, figures of merit $M_1$ and $M_2$ are for a fundamental mode vibration and a second overtone mode vibration, respectively.

Also, a frequency difference $\Delta f$ of resonance frequency $f_s$ of mechanical series independent on the shunt capacitance and resonance frequency $f_r$ dependent on the shunt capacitance is inversely proportional to the figure of merit $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal tuning fork resonator becomes because the resonance frequency $f_r$ of the resonator is almost never dependent on the shunt capacitance. Namely, the flexural mode, quartz crystal tuning fork resonator can be provided with a high time accuracy.

In detail, a quartz crystal tuning fork resonator capable of vibrating in a flexural mode can be obtained with figure of merit $M_1$ of a fundamental mode vibration larger than figure of merit $M_2$ of a second overtone mode vibration by the above-described tuning fork shape, grooves and dimensions. That is to say, $M_1 > M_2$. As an example, when resonance frequency of a quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the quartz crystal tuning fork resonator has a value of $M_1 > 65$ and $M_2 < 30$, respectively.

Namely, the flexural mode, quartz crystal tuning fork resonator which is capable of vibrating in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively.

Therefore, the resonator capable of vibrating in the fundamental mode vibration can be provided with a high time accuracy because it has the high frequency stability. Consequently, a quartz crystal oscillating circuit comprising the flexural mode, quartz crystal tuning fork resonator of this embodiment outputs a frequency of the fundamental mode vibration as an output signal, and the frequency of the output signal has a very high stability, namely, an excellent time accuracy. In other words, the quartz crystal oscillator of this embodiment has a remarkable effect such that a frequency change by ageing becomes very small. Also, a frequency of a fundamental mode vibration of the present invention is less than 200 kHz, preferably, within a range of 10 kHz to 200 kHz. Especially, 32.768 kHz is used widely, and for example, frequency adjustment is performed so that the frequency deviation is within a range of −100 PPM to +100 PPM. As is apparent from the previous description, a quartz crystal oscillating circuit can be provided with the flexural mode, quartz crystal tuning fork resonator whose figure of merit $M_1$ for the fundamental mode vibration is larger than figure of merit $M_2$ for the second overtone mode vibration.

By constructing the space $W_4$ of between tuning fork tines and groove width $W_2$ as described above, it is easy to form the tuning fork tines and grooves which are provided at the tuning fork tines separately, namely, by a separate step. However, in order to form the tuning fork tines and the grooves simultaneously, it is necessary to obtain an optimum dimension of tine thickness t, groove width $W_2$, space $W_4$ of the tines and groove area $S(=l_1 \times W_2)$. For example, when the tine thickness t is within a range of 0.06 mm to 0.15 mm, the groove width $W_2$, the groove area S and the space $W_4$ are constructed so that they are within a range of 0.02 mm to 0.08 mm, 0.023 mm$^2$ to 0.098 mm$^2$ and 0.05 mm to 0.35 mm, respectively. This is the reason why crystalline characteristics of quartz crystal and/or a groove shape are used and from the crystalline characteristics and/or the groove shape the grooves(which are not through holes) and the tuning fork tines are formed simultaneously, namely, by a simultaneous step using a photolithographic process and an etching process. As an example of the groove shape, groove width $W_2$ is not constant along the length direction of tuning fork tines or grooves are divided into the length direction thereof.

In addition, groove length $l_1$ of the present invention is length of grooves constructed at tuning fork tines so that the ratio($t_1/t$) of the groove thickness $t_1$ and the tine thickness t is less than 0.79, and the ratio($W_2/W$) of the groove width $W_2$ and the tine width W is larger than 0.35 and less than 1, when the grooves are constructed only at the tuning fork tines, and also, when the grooves constructed at the tuning fork tines extend into a tuning fork base and at least one groove is constructed between the grooves extended into the tuning fork base, groove length $l_1$ of the present invention is length of grooves constructed at the tuning fork tines and the tuning fork base(groove length $l_3$).

Namely, when the grooves constructed at the tuning fork tines extend into the tuning fork base and at least one groove is not constructed between the grooves extended into the tuning fork base, the groove length $l_1$ of the present invention is length of grooves constructed at the tuning fork tines. Also, when the grooves of the tines are divided into the length direction thereof or connected via at least one step portion, the groove length $l_1$ is total length of the length direction satisfying the ratios($t_1/t$) and ($W_2/W$) described above. In addition, the groove thickness $t_1$ of the present invention is the thinnest thickness of the grooves because quartz crystal is an anisotropic material and the groove thickness $t_1$ has a distribution when it is formed by a chemical etching method.

In summary the embodiments shown within FIG. 3 to FIG. 5, the tuning fork tines have four grooves within the obverse and the reverse faces thereof and electrodes provided inside the grooves as well as electrodes disposed on both sides of the tuning fork tines. The embodiments of the present invention, however, may have at least one groove within at least one surface of the tuning fork tines and an electrode inside the at least one groove as well as electrodes disposed on both sides of the tuning fork tine. Also, it is provided that the first electrode inside the groove and the second electrodes on said side of the tine next to said electrode are of opposite electrical polarity.

Figure 6:
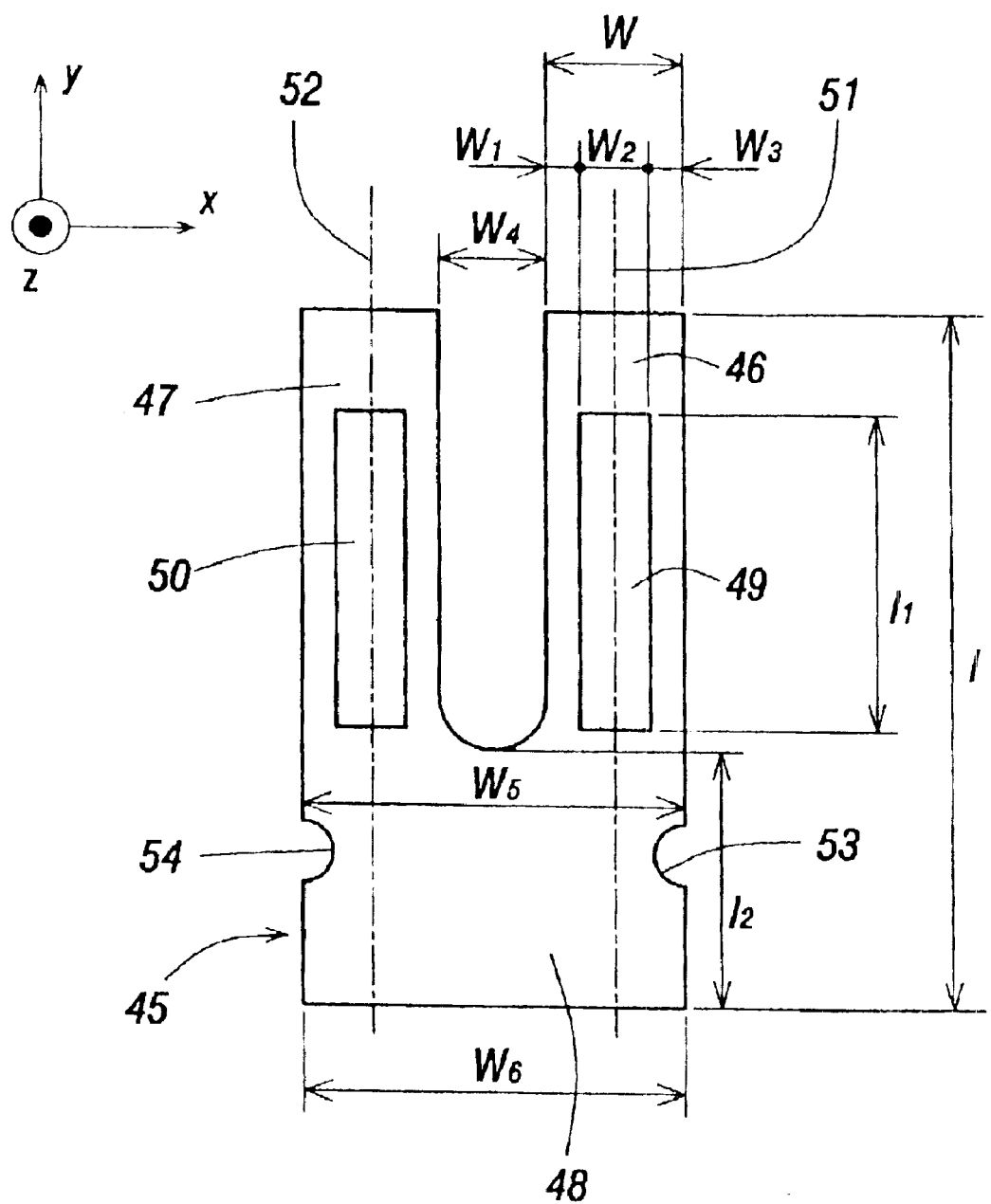
FIG. 6 shows a plan view of a flexural mode, quartz crystal tuning fork resonator which constructs a quartz crystal oscillator of the second embodiment of the present invention.

FIG. 6 shows a plan view of a flexural mode, quartz crystal tuning fork resonator 45 which constructs a quartz crystal oscillator of the second embodiment of the present invention. The quartz crystal resonator 45 comprises tuning fork tines 46, 47 and a tuning fork base 48. The tines 46, 47 and the base 48 are formed integrally by a chemical etching process. In this embodiment, the base 48 has cut portions 53 and 54. Also, a groove 49 is constructed to include a portion of the central line 51 of the tine 46, a groove 50 is similarly constructed to include a portion of the central line 52 of the tine 47. In this embodiment, the grooves 49 and 50 are constructed at a part of the tines 46 and 47, and have groove width $W_2$ and groove length $l_1$. In more detail, groove area S $(=W_2 \times l_1)$ has a value of 0.025 mm$^2$ to 0.12 mm$^2$ because it is very easy to form the grooves by a chemical etching process and the flexural mode, quartz crystal tuning fork resonator can be provided with excellent electromechanical transformation efficiency by the formation of the grooves.

Namely, the flexural mode, quartz crystal tuning fork resonator, capable of vibrating in a fundamental mode and having a high frequency stability can be obtained with a small series resistance $R_1$ and a high quality factor $Q_1$. Therefore, a quartz crystal oscillator having the high frequency stability can be realized with an output signal of a frequency of the fundamental mode vibration. In this embodiment, though electrodes are not shown in FIG. 6, the electrodes are disposed inside the grooves 49, 50 and on sides of the tuning fork tines 46 and 47, similar to FIG. 4. In detail, the electrodes are disposed opposite each other inside the grooves and on the sides of the tuning fork tines so that the electrodes disposed opposite each other are of opposite electrical polarity. In more detail, the grooves have a rectangular shape in the plan view, and each tuning fork tine has two step difference portions along the length direction thereof, and electrodes are disposed on the step difference portions, namely inside the grooves. Therefore, the electrodes are disposed opposite each other on the step difference portions of the grooves and the sides of the tuning fork tines so that the electrodes disposed opposite each other are of opposite electrical polarity.

Also, in this embodiment, the width $W_2$ of the grooves 49 and 50 (groove width $W_2$) which include a portion of the central lines 51 and 52, respectively, is preferable because moment of inertia of the tines 46 and 47 becomes large and the tines can vibrate in a flexural mode very easily. As a result of which the flexural mode, quartz crystal tuning fork resonator, capable of vibrating in a fundamental mode and having a high frequency stability can be obtained with a small series resistance $R_1$ and a high quality factor $Q_1$. Also, though grooves of reverse face of the tines are not shown in FIG. 6, the grooves are constructed opposite each other to the grooves 49 and 50 at the reverse face of the tines 46 and 47, and electrodes are disposed inside the grooves and on sides of the tines, similar to FIG. 4.

In addition, the base 48 has cut portions 53 and 54, and the cut base 48 has a dimension of width $W_5$ (tines side) and width $W_6$ (opposite side to the tines side). When the base 48 is mounted at a mounting portion of a case of surface mounting type or tubular type by solder or conductive adhesives, it is necessary to satisfy $W_6 \geq W_5$ to decrease energy losses by vibration. The cut portions 53 and 54 are very effective to decrease the energy losses. Therefore, the flexural mode, quartz crystal tuning fork resonator, capable of vibrating in the fundamental mode and having the high frequency stability (high time accuracy) can be provided with a small series resistance $R_1$ and a high quality factor $Q_1$. Also, the width dimensions $W=W_1+W_2+W_3$ and $W_4$, and the length dimensions $l_1$, $l_2$ and $l$ are as already described in relation to FIG. 5.

Figure 7:
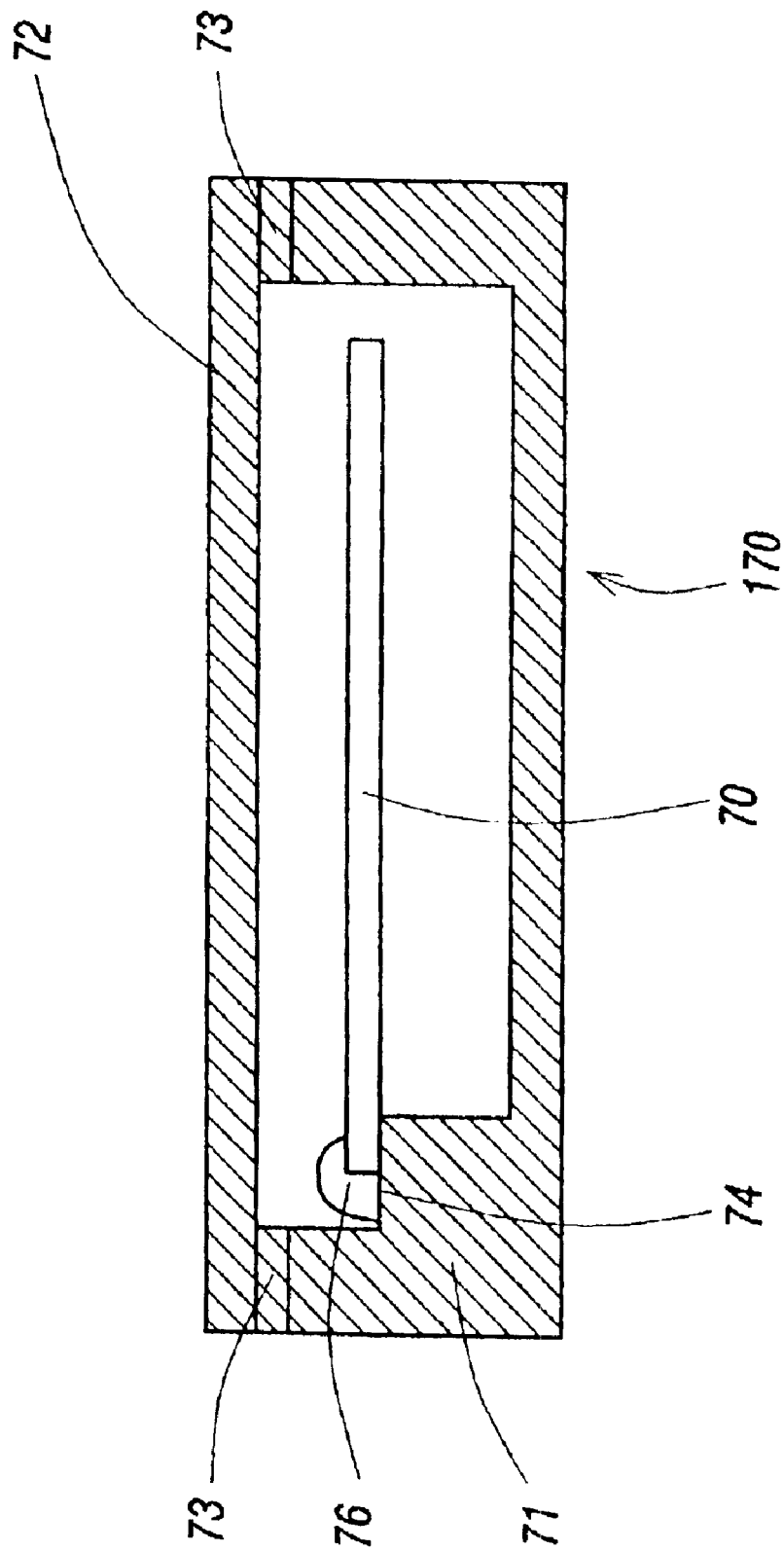
FIG. 7 shows a cross-sectional view of a quartz crystal unit which constructs a quartz crystal oscillator of the third embodiment of the present invention.

FIG. 7 shows a cross-sectional view of a quartz crystal unit which constructs a quartz crystal oscillator of the third embodiment of the present invention. The quartz crystal unit 170 comprises a flexural mode, quartz crystal tuning fork resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. The resonator 70 in this embodiment is the same resonator as one of the flexural mode, quartz crystal tuning fork resonators 10 and 45 described in detail in FIG. 3–FIG. 6. Also, in this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of surface mounting type is shown, but the quartz crystal tuning fork resonator may be housed in tubular type, namely the quartz crystal unit of tubular type.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 8.

Figure 8:
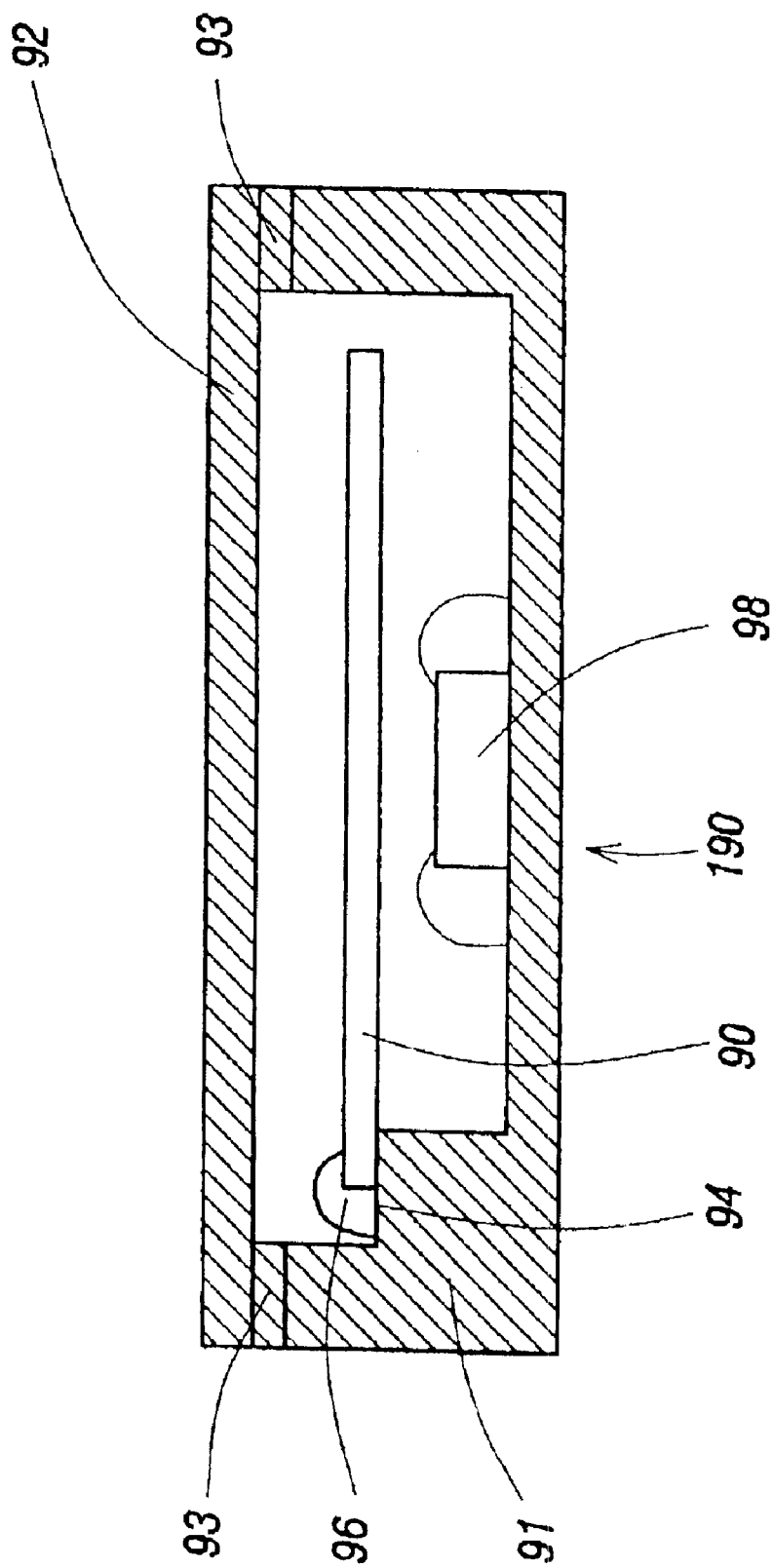
FIG. 8 shows a cross-sectional view of a quartz crystal oscillator of the fourth embodiment of the present invention.

FIG. 8 shows a cross-sectional view of a quartz crystal oscillator of the fourth embodiment of the present invention. The quartz crystal oscillator 190 comprises a quartz crystal oscillating circuit, a case 91 and a lid 92. In this embodiment, circuit elements constructing the oscillating circuit are housed in a quartz crystal unit comprising a flexural mode, quartz crystal tuning fork resonator 90, the case 91 and the lid 92. Also, the quartz crystal oscillating circuit of this embodiment comprises an amplifier 98 including a feedback resistor, the quartz crystal tuning fork resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder. As described above, the amplifier 98 is housed in the quartz crystal unit and mounted at the case 91. Also, the case 91 and the lid 92 are connected through a connecting member 93. The resonator 90 of this embodiment is the same as one of the flexural mode, quartz crystal tuning fork resonators 10 and 45 described in detail in FIG. 3–FIG. 6. In this embodiment, though the resonator and the amplifier are housed in the same room, the present invention is not limited to this, for example, a room of the case is divided into two rooms by a divided portion, and the amplifier is housed in one of the two rooms and the flexural mode, quartz crystal tuning fork resonator is housed in other room. Namely, the resonator and the amplifier are housed in a separate room.

Likewise, in this embodiment, a piece of flexural mode, quartz crystal tuning fork resonator is housed in the unit, but the present invention also includes a quartz crystal unit having a plurality of flexural mode, quartz crystal tuning fork resonators, and at least two of the plurality of resonators are connected electrically in parallel. In addition, the at least two resonators may be an individual resonator or may be an individual resonator that is formed integrally at each tuning base through a connecting portion.

Next, a method of manufacturing a quartz crystal oscillator of the present invention and a quartz crystal unit which is used in the quartz crystal oscillator are described in detail below.

Figure 9:
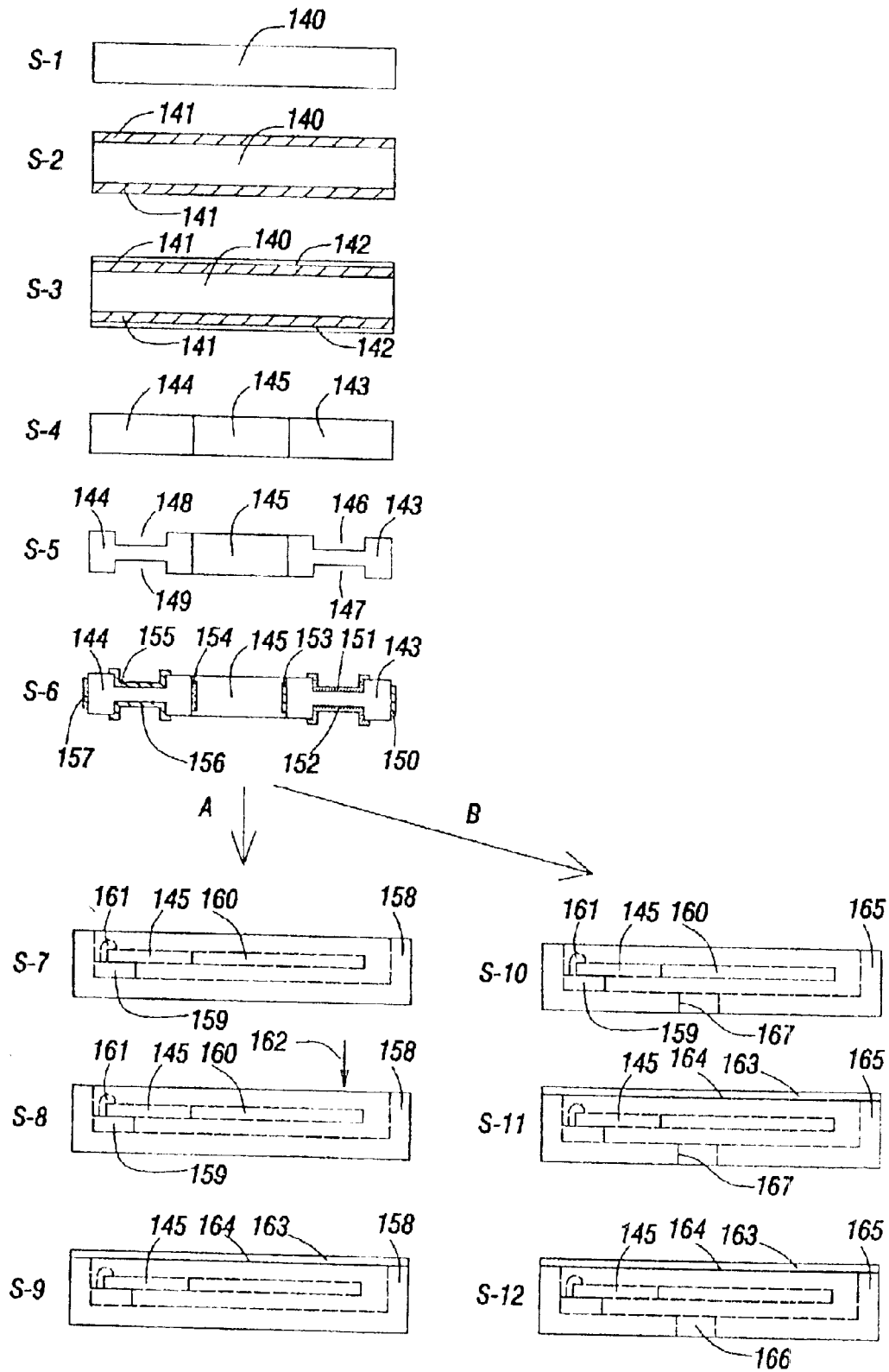
FIG. 9 shows a step diagram of a method for manufacturing a quartz crystal oscillator of the present invention and a quartz crystal unit which is used in the quartz crystal oscillator.
Figure 10:
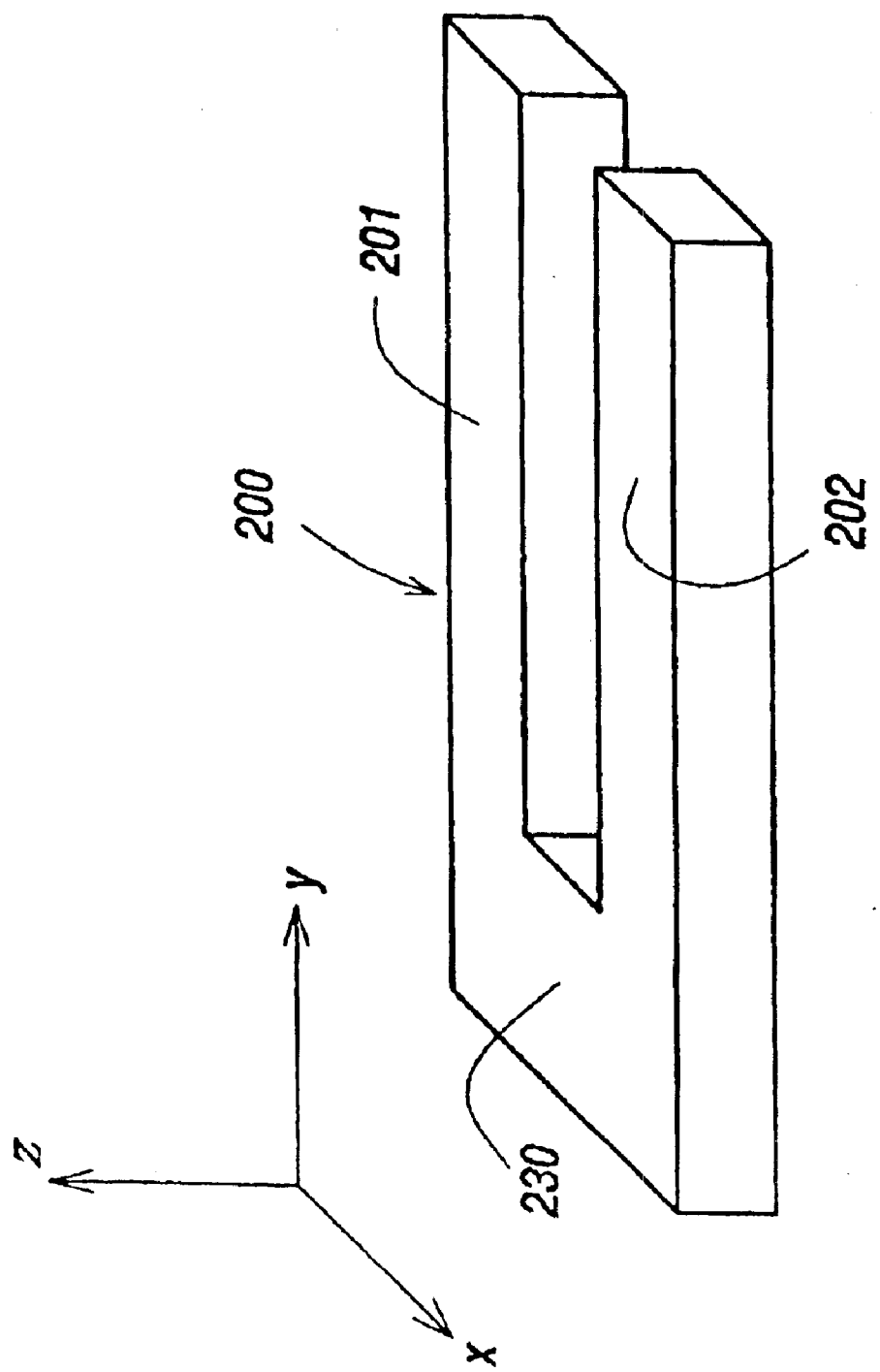
FIG. 10 is a general view of the conventional flexural mode, quartz crystal tuning fork resonator which constructs the quartz crystal oscillator of the prior art.
Figure 11:
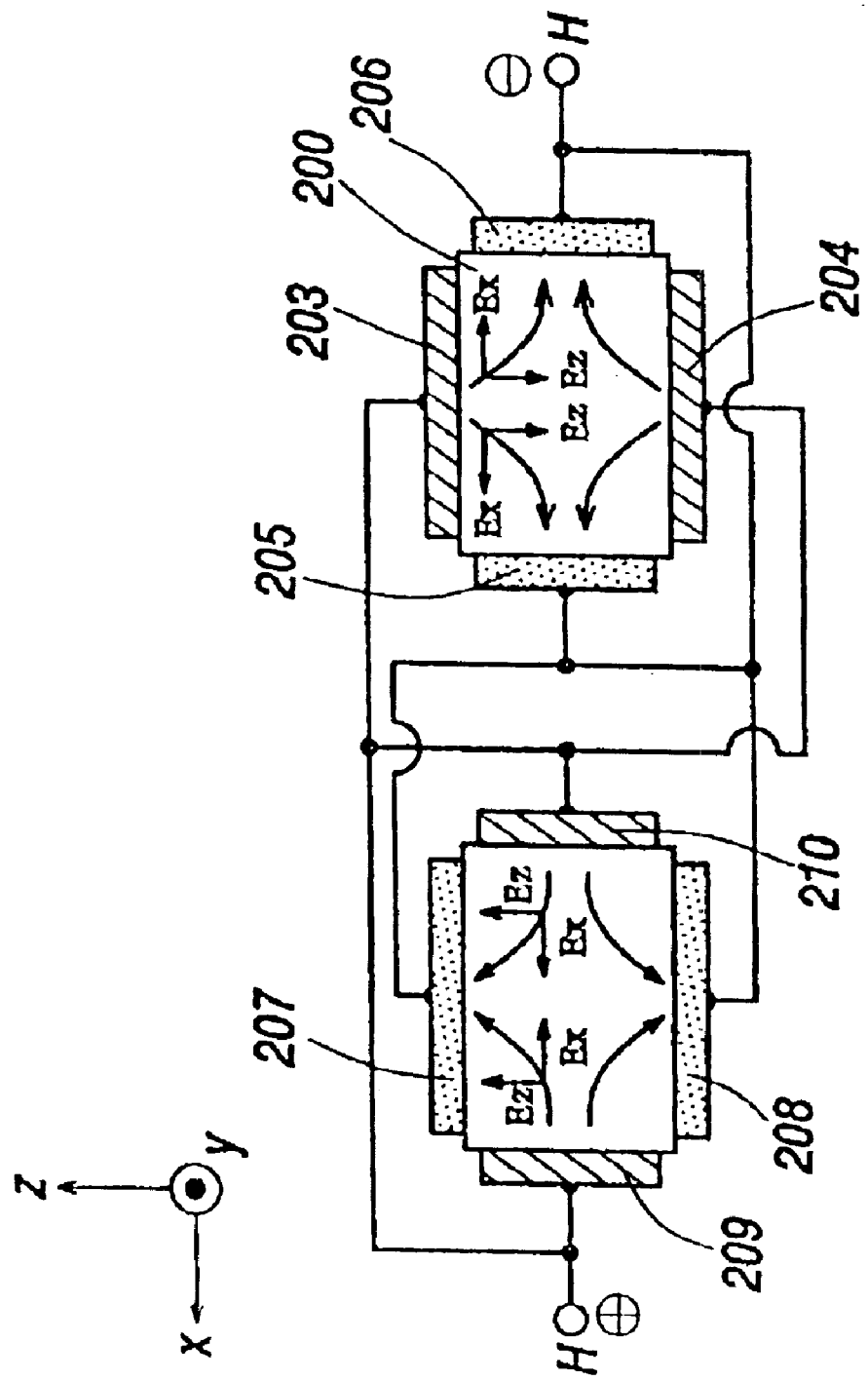
FIG. 11 is a cross-sectional view of the tuning fork tines of FIG. 10 illustrating the electrode construction.

FIG. 9 shows an embodiment of a method for manufacturing a quartz crystal oscillator of the present invention and a step diagram embodying the present invention. The signs of S-1 to S-12 are the step numbers. First, S-1 shows a cross-sectional view of a quartz crystal wafer 140. Next, in S-2 metal film 141, for example, chromium and gold on the chromium are, respectively, disposed on upper and lower faces of the quartz crystal wafer 140 by an evaporation method or a spattering method. In addition, resist 142 is spread on said metal film 141 in S-3, and after the metal film 141 and the resist 142 were removed except those of tuning fork shape by a photo-lithographic process and an etching process, the tuning fork shape with tuning fork tines 143, 144 and a tuning fork base 145, as be shown in S-4, is integrally formed by a chemical etching process. When the tuning fork shape is formed, cut portions may be formed at the tuning fork base. In FIG. 9 the formation of a piece of tuning fork shape is shown, but, a number of tuning fork shapes are actually formed in a piece of quartz crystal wafer.

Similar to the steps of S-2 and S-3, metal film and resist are spread again on the tuning fork shape of S-4 and grooves 146, 147, 148 and 149 each of which has two step difference portions along the length direction of the tuning fork tines, are formed at the tuning fork tines 143, 144 by the photo-lithographic process and the etching process, and the shape of S-5 is obtained after all of the resist and the metal film were removed. In addition, metal film and resist are spread again on the shape of S-5 and electrodes which are of opposite electrical polarity, are disposed on sides of the tuning fork tines and inside the grooves thereof, as be shown in is S-6.

Namely, electrodes 150, 153 disposed on the sides of the tuning fork tine 143 and electrodes 155, 156 disposed inside the grooves 148, 149 of the tuning fork tine 144 have the same electrical polarity. Similarly, electrodes 151, 152 disposed inside the grooves 146, 147 of the tuning fork tine 143 and electrodes 154, 157 disposed on the sides of the tuning fork tine 144 have the same electrical polarity. Two electrode terminals are, therefore, constructed. In more detail, when an alternating current (AC) voltage is applied between the terminals, the tuning fork tines are capable of vibrating in a flexural mode of inverse phase because said electrodes disposed on step difference portions of the grooves and the electrodes disposed opposite to the said electrodes have opposite electrical polarity. In the step of S-6, a piece of quartz crystal tuning fork resonator capable of vibrating in a flexural mode is shown in the quartz crystal wafer, but a number of quartz crystal tuning fork resonators are actually formed in the quartz crystal wafer.

In addition, resonance frequency for said resonators is adjusted by a separate step of at least twice and the first adjustment of resonance frequency for said resonators is performed in the quartz crystal wafer by laser or evaporation or plasma etching method so that a frequency deviation of said resonators is within a range of −9000 PPM to +5000 PPM(Parts Per Million). The adjustment of frequency by laser or plasma etching method is performed by trimming mass disposed on tuning fork tines and the adjustment of frequency by an evaporation method is performed by adding mass on tuning fork tines. Namely, those methods can change the resonance frequency of said resonators. Also, the resonators formed in the quartz crystal wafer are inspected therein and when there are failure resonators, something is marked on them in the quartz crystal wafer or they are removed from the quartz crystal wafer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously. In addition, the grooves each of which has two step difference portions along the direction of length of the tuning fork tines, are formed in this embodiment, but, each of the grooves may have step difference portions more than two, at least two of which are connected via at least one step portion.

There are two methods of A and B in the following step, as be shown by arrow signs. For the step of A, the tuning fork base 145 of the formed flexural mode, quartz crystal tuning fork resonator 160 is first mounted on mounting portion 159 of a case 158 by conductive adhesives 161 or solder, as be shown in S-7. Next, the second adjustment of resonance frequency for the resonator 160 is performed by laser 162 or evaporation or plasma etching method in S-8 so that a frequency deviation is within a range of −100 PPM to +100 PPM. Finally, the case 158 and a lid 163 are connected via glass 164 with the low melting point or a metal in S-9. In this case, the connection of the case and the lid is performed in vacuum because the case 158 has no hole to close it in vacuum.

In addition, though it is not visible in FIG. 9, the third frequency adjustment may be performed by laser after the step of the connection of S-9 to get a small frequency deviation when a material of the lid is glass. As a result of which it is possible to get the resonator with the frequency deviation which is within a range of −50 PPM to +50 PPM.

A nominal frequency capable of vibrating in a fundamental mode is less than 200 kHz, especially, 32.768 kHz is widely used in communication equipment as a time standard. In this step, when the third frequency adjustment is performed, the resonance frequency of said resonators is adjusted so that the frequency deviation by the second frequency adjustment is within a range of −950 PPM to +950 PPM.

For the step of B, the tuning fork base 145 of the formed resonator 160 is first mounted on mounting portion 159 of a case 165 by conductive adhesives 161 or solder in S-10, in addition, in S-11 the case 165 and a lid 163 are connected by the same way as that of S-9, in more detail, after the resonator was mounted on the mounting portion of the case or after the resonator was mounted at the mounting portion, and the case and the lid were connected, the second adjustment of resonance frequency is performed so that a frequency deviation is generally within a range of −100 PPM to +100 PPM in vacuum, but, it may be within a wider range, for example, −950 PPM to +950 PPM when the third frequency adjustment as will be shown as follows, is performed. Finally, a hole 167 constructed at the case 165 is closed in vacuum using such a metal 166 as solder or glass with the low melting point in S-12.

Also, similar to the step of A, the third adjustment of resonance frequency may be performed by laser after the step of S-12 to get a small frequency deviation. As a result of which it is possible to get the resonator with the frequency deviation which is within a range of −50 PPM to +50 PPM. Thus, a frequency deviation of the resonators in the case of A and B is finally within a range of −100 PPM to +100 PPM at most. Also, the second frequency adjustment may be performed after the case and the lid were connected and the hole was closed in vacuum. In addition, the hole is constructed at the case, but may be constructed at the lid. Also, the frequency adjustment of the present invention is performed in vacuum or inert gas such as nitrogen gas or atmosphere, and the values described above are values in vacuum.

Therefore, the flexural mode, quartz crystal tuning fork resonators and the quartz crystal units manufactured by the above-described method are miniaturized and realized with a small series resistance $R_1$, a high quality factor $Q_1$ and low price.

Moreover, in the above-described embodiment, though the first frequency adjustment of the resonators is performed in the quartz crystal wafer and at the same time, when there is a failure resonator, something is marked on it or it is removed from the quartz crystal wafer, but the present invention is not limited to this, namely, the present invention may include the step to inspect the flexural mode, quartz crystal tuning fork resonators formed in the quartz crystal wafer therein, in other words, the step to inspect whether there is a failure resonator or not in the quartz crystal wafer. When there is the failure resonator in the wafer, something is marked on it or it is removed from the wafer or it is remembered by a computer. By including the step, it can increase the yield because it is possible to find out the failure resonator in an early step and the failure resonator does not go to the next step. As a result of which low priced flexural mode, quartz crystal tuning fork resonators can be provided with excellent electrical characteristics.

In this embodiment, the frequency adjustment is performed three times by a separate step, but may be performed at least twice by a separate step. For example, the third frequency adjustment may be omitted. In addition, in order to construct a quartz crystal oscillator, two electrode terminals of the resonators are connected electrically to an amplifier, capacitors and resistors. Namely, a quartz crystal oscillating circuit comprises the step of connecting electrically the flexural mode, quartz crystal tuning fork resonator, an amplifier and capacitors at least, In more detail, the quartz crystal oscillating circuit is constructed and connected electrically so that an amplification circuit comprises a CMOS inverter and a feedback resistor and a feedback circuit comprises the flexural mode, quartz crystal tuning fork resonator, the drain resistor, the capacitor of a gate side and the capacitor of a drain side. Also, the third frequency adjustment may be performed after the quartz crystal oscillating circuit was constructed.

In addition, an insulation material such as $S_iO_2$ may be constructed on obverse and reverse faces of the width $W_1$ and the width $W_3$ of the tuning fork tines to prevent a short circuit of between the electrodes of the sides and the grooves thereof, and the insulation material is formed by a spattering method or an evaporation method. Also, when a tuning fork shape comprising tuning fork tines and a tuning fork base is formed by a photo-lithographic process and an etching process, cut portions may be also formed simultaneously at the tuning fork base.

Likewise, in the present embodiments the flexural mode quartz crystal resonator of tuning fork type has two tuning fork tines, but embodiments of the present invention include tuning fork tines more than two. In addition, the quartz crystal tuning fork resonators of the present embodiments are housed in a package (unit) of surface mounting type comprising a case and a lid, but may be housed in a package of tubular type.

In addition, in this embodiment, the grooves are constructed to include a portion of the central line of the tines, but the present invention is not limited to this, for example, the grooves may be constructed with the portion of the central line of the tines and at both sides thereof. In this case, a part width $W_7$ including the portion the central line of the tines is less than 0.05 mm. Also, each groove width is less than 0.04 mm and a ratio ($t_1/t$) of groove thickness $t_1$ and tine thickness $t$ is less than 0.79. By constructing the part width $W_7$, the groove width and the thickness ratio like this, $M_1$ becomes larger than $M_2$. Namely, the flexural mode, quartz crystal tuning fork resonator, capable of vibrating in a fundamental mode and having a high frequency stability can be provided because the second overtone mode vibration can be suppressed.

In addition, for the flexural mode, quartz crystal tuning fork resonators constructing the quartz crystal oscillators of the first embodiment to the fourth embodiment of the present invention, the resonators are constructed so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration.

In more detail, for example, when $C_L$=18 pF and the $C_L$ changes in 1 pF, the frequency change of the fundamental mode vibration becomes larger than that of the second overtone mode vibration because the capacitance ratio $r_1$ is smaller than the capacitance ratio $r_2$. Therefore, there is a remarkable effect for the fundamental mode vibration, such that the resonators can be provided with the frequency variable in the wide range, even when the value of load capacitance $C_L$ changes slightly. Accordingly, when a variation of the same frequency is required, the number of capacitors which are used in the quartz crystal oscillators decreases because the frequency change versus load capacitance 1 pF becomes large, as compared with that of the second overtone mode vibration. As a result, the low priced oscillators can be provided.

Moreover, capacitance ratios $r_1$ and $r_2$ of a flexural mode, quartz crystal tuning fork resonator are given by $r_1=C_0/C_1$ and $r_2=C_0/C_2$, respectively, where $C_0$ is shunt capacitance in an electrical equivalent circuit of the resonator, and $C_1$ and $C_2$ are, respectively, motional capacitance of a fundamental mode vibration and a second overtone mode vibration in the electrical equivalent circuit of the resonator. In addition, the flexural mode, quartz crystal tuning fork resonator has a quality factor $Q_1$ for the fundamental mode vibration and a quality factor $Q_2$ for the second overtone mode vibration.

In detail, the quartz crystal tuning fork resonator of this embodiment is constructed so that the influence on resonance frequency of the fundamental mode vibration by the shunt capacitance becomes smaller than that of the second overtone mode vibration by the shunt capacitance, namely, so that it satisfies a relationship of $r_1/2Q_1^2 < r_2/2Q_2^2$. As a result of which the flexural mode, quartz crystal tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, the $S_1$ and $S_2$ are called "stable factor of frequency" of the fundamental mode vibration and the second overtone mode vibration. Namely, the $S_1$ and $S_2$ are given by $S_1=r_1/2Q_1^2$ and $S_2=r_2/2Q_2^2$, respectively.

The above-described resonators are formed by at least one method of chemical, mechanical and physical etching methods. For example, the physical etching method is a method by ion etching.

As described above, it will be easily understood that the quartz crystal oscillators comprising the quartz crystal oscillating circuit having the flexural mode, quartz crystal tuning fork resonator with novel shapes, the novel electrode construction and excellent electrical characteristics, and having a relationship of the amplification circuit and the feedback circuit, according to the present invention may have the outstanding effects. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A method for manufacturing a quartz crystal unit, comprising the steps of:
    forming a quartz crystal tuning fork resonator capable of vibrating in a flexural mode by etching a quartz crystal wafer in a first etching process to form a quartz crystal tuning fork base and a plurality of quartz crystal tuning fork tines connected to the quartz crystal tuning fork base, etching the quartz crystal wafer in a second etching process different from the first etching process to form a groove having stepped portions in at least one of opposite main surfaces of each of the quartz crystal tuning fork tines, disposing a plurality of first electrodes having a first electrical polarity on the stepped portions of the grooves of respective ones of the quartz crystal tuning fork tines, and disposing a plurality of second electrodes having a second electrical polarity on side surfaces of respective ones of the quartz crystal tuning fork tines, the second electrical polarity being opposite to the first electrical polarity;

providing a case having an interior space and an open end communicating with the interior space;

providing a lid for covering the open end of the case;

mounting the quartz crystal tuning fork resonator in the interior space of the case; and connecting the lid to the case to cover the open end thereof.

2. A method according to claim 1; wherein the quartz crystal wafer is etched to form the quartz crystal tuning fork tines before the quartz crystal wafer is etched to form the grooves.

3. A method according to claim 1; wherein the quartz crystal wafer is etched to form the grooves before the quartz crystal wafer is etched to form the quartz crystal tuning fork tines.

4. A method according to claim 1; wherein the opposite main surfaces of each of the quartz crystal tuning fork tines comprise a first main surface and a second main surface opposite the first main surface, each of the first and second main surfaces having a central linear portion; and wherein the grooves are formed in the central linear portions of respective ones of the first and second main surfaces of the quartz crystal tuning fork tines so that a spaced-apart distance between the quartz crystal tuning fork tines is greater than or equal to a width of the groove formed in the central linear portion of one of the first and second main surfaces of each of the quartz crystal tuning fork tines.

5. A method according to claim 4; wherein the quartz crystal tuning fork resonator has a fundamental mode of vibration and a second overtone mode of vibration, and a merit value $M_2$ for the second overtone mode of vibration of the quartz crystal tuning fork resonator is less than 30 so that the second overtone mode of vibration thereof is suppressed, the merit value $M_2$ being defined by a ratio $Q_2/r_2$ where $Q_2$ and $r_2$ represent a quality factor and a capacitance ratio, respectively, of the quartz crystal tuning fork resonator capable of vibrating in the second overtone mode.

6. A method according to claim 5; wherein a width $W_2$ of the groove formed in at least one of first and second main surfaces of each of the quartz crystal tuning fork tines is within a range of 0.03 mm to 0.12 mm; and wherein a ratio $W_2/W$ is greater than 0.35 and less than 1, where W represents a width of each of the tuning fork tines.

7. A method according to claim 5; further comprising the step of adjusting an oscillation frequency of the fundamental mode of vibration of the quartz crystal tuning fork resonator using a laser beam after connecting the lid to the case so that the oscillation frequency is about 32.768 kHz with a frequency deviation within the range of −100 PPM to +100 PPM.

8. A method according to claim 6; wherein a length of the groove formed in at least one of the first and second main surfaces of each of the quartz crystal tuning fork tines is within a range of 40% to 80% of a length of each of the tuning fork tines.

9. A method for manufacturing a quartz crystal unit, comprising the steps of:

forming a quartz crystal tuning fork resonator capable of vibrating in a flexural mode by etching a quartz crystal wafer to form a quartz crystal tuning fork base and a plurality of quartz crystal tuning fork tines connected to the quartz crystal tuning fork base, etching the quartz crystal wafer to form a groove having stepped portions in at least one of opposite main surfaces of each of the quartz crystal tuning fork tines, disposing a plurality of first electrodes having a first electrical polarity on the stepped portions of the grooves of respective ones of the quartz crystal tuning fork tines, and disposing a plurality of second electrodes having a second electrical polarity on side surfaces of respective ones of the quartz crystal tuning fork tines, the second electrical polarity being opposite to the first electrical polarity;

providing a case having an interior space and an open end communicating with the interior space;

providing a lid for covering the open end of the case;

mounting the quartz crystal tuning fork resonator in the interior space of the case; and connecting the lid to the case to cover the open end thereof;

wherein a width $W_2$ of the groove formed in at least one of the opposite main surfaces of each of the quartz crystal tuning fork tines is within a range of 0.03 mm to 0.12 mm; and wherein a ratio $W_2/W$ is greater than 0.35 and less than 1, where W represents a width of each of the tuning fork tines; and wherein a length of the groove formed in at least one of the opposite main surfaces of each of the quartz crystal tuning fork tines is within a range of 40% to 80% of a length of each of the tuning fork tines.

10. A method according to claim 9; wherein the quartz crystal tuning fork resonator has a fundamental mode of vibration and a second overtone mode of vibration, and a merit value $M_2$ for the second overtone mode of vibration of the quartz crystal tuning fork resonator is less than 30 so that the second overtone mode of vibration thereof is suppressed, the merit value $M_2$ being defined by a ratio $Q_2/r_2$ where $Q_2$ and $r_2$ represent a quality factor and a capacitance ratio, respectively, of the quartz crystal tuning fork resonator capable of vibrating in the second overtone mode.

11. A method according to claim 10; wherein a thickness $t_1$ of the groove is within a range of 0.06 mm to 0.15 mm; and wherein a ratio $t_1/t$ is less than 0.79, where t represents a thickness of each of the tuning fork tines.

12. A method according to claim 10; wherein the groove formed in at least one of the opposite main surfaces of each of the quartz crystal tuning fork tines comprises a through-hole.

13. A method for manufacturing a quartz crystal oscillator, comprising the steps of:

providing a feedback circuit by forming a quartz crystal tuning fork resonator capable of vibrating in a flexural mode of an inverse phase by etching a quartz crystal wafer in a first etching process to form a quartz crystal tuning fork base and a plurality of quartz crystal tuning fork tines connected to the quartz crystal tuning fork base, etching the quartz crystal wafer in a second etching process different from the first etching process to form a groove having stepped portions in at least one of opposite main surfaces of each of the quartz crystal tuning fork tines, disposing a plurality of first electrodes having a first electrical polarity on the stepped portions of the grooves of respective ones of the quartz crystal tuning fork tines, and disposing a plurality of second electrodes having a second electrical polarity on side surfaces of respective ones of the quartz crystal tuning fork tines, the second electrical polarity being opposite to the first electrical polarity;

mounting the quartz crystal tuning fork resonator in an interior space of a case having an open end communicating with the interior space;

connecting a lid to the case to cover the open end thereof; and electrically connecting the quartz crystal tuning fork resonator of the feedback circuit to an amplification circuit comprised of a CMOS inverter and a feedback resistor.

14. A method according to claim 13; wherein the amplification circuit and the quartz crystal tuning fork resonator constitute a quartz crystal oscillating circuit of the quartz crystal oscillator for outputting through a buffer circuit an output signal having an oscillating frequency of a fundamental mode of vibration of the quartz crystal tuning fork resonator; and further comprising the step of adjusting the oscillation frequency of the fundamental mode of vibration of the quartz crystal tuning fork resonator using a laser beam after connecting the lid to the case so that the oscillation frequency is about 32.768 kHz with a frequency deviation within the range of −950 PPM to +950 PPM.

15. A method according to claim 14; wherein one of the case and the lid has a through-hole; and further comprising the step of covering the through hole with a member formed of one of a metal or glass.

16. A method according to claim 15; further comprising the step of adjusting an oscillation frequency of the fundamental mode of vibration of the quartz crystal tuning fork resonator using a laser beam so that the oscillation frequency is about 32.768 kHz with a frequency deviation within the range of −50 PPM to +50 PPM.

17. A method according to claim 13; wherein the opposite main surfaces of each of the quartz crystal tuning fork tines comprise a first main surface and a second main surface opposite the first main surface, each of the first and second main surfaces having a central linear portion; and wherein the grooves are formed in the central linear portions of respective ones of the first and second main surfaces of the quartz crystal tuning fork tines so that a width of at least one of the grooves is greater than or equal to a distance in the width direction of the groove measured from an outer edge of the groove to an outer edge of the tuning fork tine in which the groove is formed.

18. A method according to claim 17; wherein the quartz crystal tuning fork tines ar formed before the groove is formed.

19. A method according to claim 17; wherein the groove is formed before the quartz crystal tuning fork tines are formed.

20. A method according to claim 17; wherein a spaced-apart distance between the quartz crystal tuning fork tines is greater than or equal to a width of the groove formed in the central linear portion of one of the first and second main surfaces of each of the quartz crystal tuning fork tines.

21. A method according to claim 17; wherein the quartz crystal tuning fork resonator has a fundamental mode of vibration and a second overtone mode of vibration; and wherein a ratio of an absolute value of negative resistance $-RL_1$ of the fundamental mode of vibration of the amplification circuit and a series resistance $R_1$ of the fundamental mode of vibration of the quartz crystal tuning fork resonator is greater than that of an absolute value of negative resistance $-RL_2$ of the second overtone mode of vibration of the amplification circuit and a series resistance $R_2$ of the second overtone mode of vibration thereof.

22. A method according to claim 17; wherein the quartz crystal tuning fork resonator has a fundamental mode of vibration and a second overtone mode of vibration; and wherein a ratio of an amplification rate $\alpha_1$ of the fundamental mode of vibration and an amplification rate $\alpha_2$ of the second overtone mode of vibration of the amplification circuit is greater than that of a feedback rate $\beta_2$ of the second overtone mode of vibration and a feedback rate $\beta_1$ of the fundamental mode of vibration of the feedback circuit, and a product of the amplification rate $\alpha_1$ and the feedback rate $\beta_1$ of the fundamental mode of vibration is greater than 1.

23. A method according to claim 21; wherein a merit value $M_2$ for the second overtone mode of vibration of the quartz crystal tuning fork resonator is less than 30 so that the second overtone mode of vibration thereof is suppressed, the merit value $M_2$ being defined by a ratio $Q_2/r_2$ where $Q_2$ and $r_2$ represent a quality factor and a capacitance ratio, respectively, of the quartz crystal tuning fork resonator capable of vibrating in the second overtone mode.

24. A method according to claim 23; wherein a width $W_2$ of the groove formed in the central linear portion of one of the first and second main surfaces of each of the quartz crystal tuning fork tines is within a range of 0.03 mm to 0.12 mm, and a ratio $W_2/W$ is greater than 0.35 and less than 1, where W represents a width of each of the tuning fork tines.

25. A method according to claim 24; wherein a length of the groove formed in the central linear portion of one of the first and second main surfaces of each of the quartz crystal tuning fork tines is within a range of 40% to 80% of a length of each of the tuning fork tines.

26. A method for manufacturing a quartz crystal oscillator, comprising the steps of:

forming a quartz crystal tuning fork resonator capable of vibrating in a flexural mode of an inverse phase by etching a quartz crystal wafer to form a quartz crystal tuning fork base and a plurality of quartz crystal tuning fork tines connected to the quartz crystal tuning fork base, etching the quartz crystal wafer to form a groove having stepped portions in at least one of opposite main surfaces of each of the quartz crystal tuning fork tines, disposing a plurality of first electrodes having a first electrical polarity on the stepped portions of the grooves of respective ones of the quartz crystal tuning fork tines, and disposing a plurality of second electrodes having a second electrical polarity on side surfaces of respective ones of the quartz crystal tuning fork tines, the second electrical polarity being opposite to the first electrical polarity;

mounting the quartz crystal tuning fork resonator in an interior space of a case having an open end communicating with the interior space;

connecting a lid to the case to cover the open end thereof; and electrically connecting the quartz crystal tuning fork resonator to an amplification circuit having a CMOS inverter and a feedback resistor and to capacitors and a drain resistor of a feedback circuit having the quartz crystal tuning fork resonator;

wherein the quartz crystal tuning fork resonator has a fundamental mode of vibration and a second overtone mode of vibration; and wherein a ratio of an amplification rate $\alpha_1$ of the fundamental mode of vibration and an amplification rate $\alpha_2$ of the second overtone mode of vibration of the amplification circuit is greater than that of a feedback rate $\beta_2$ of the second overtone mode of vibration and a feedback rate $\beta_1$ of the fundamental mode of vibration of the feedback circuit, and a product of the amplification rate $\alpha_1$ and the feedback rate $\beta_1$ of the fundamental mode of vibration is greater than 1.

27. A method according to claim 26; wherein the opposite main surfaces of each of the quartz crystal tuning fork tines comprise a first main surface and a second main surface opposite the first main surface, each of the first and second main surfaces having a central linear portion; and wherein the grooves are formed in the central linear portions of respective ones of the first and second main surfaces of the quartz crystal tuning fork tines so that a width of at least one of the grooves is greater than or equal to a distance in the width direction of the groove measured from an outer edge of the groove to an outer edge of the tuning fork tine in which the groove is formed.

28. A method according to claim 26; wherein the opposite main surfaces of each of the quartz crystal tuning fork tines comprise a first main surface and a second main surface opposite the first main surface, each of the first and second main surfaces having a central linear portion; and wherein the grooves are formed in the central linear portions of respective ones of the first and second main surfaces of the quartz crystal tuning fork tines so that a spaced-apart distance between the quartz crystal tuning fork tines is greater than or equal to a width of the groove formed in the central linear portion of one of the first and second main surfaces of each of the quartz crystal tuning fork tines.

29. A method according to claim 26; wherein the quartz crystal tuning fork resonator has a fundamental mode of vibration and a second overtone mode of vibration; and wherein a ratio of an absolute value of negative resistance $-RL_1$ of the fundamental mode of vibration of the amplification circuit and a series resistance $R_1$ of the fundamental mode of vibration of the quartz crystal tuning fork resonator is greater than that of an absolute value of negative resistance $-RL_2$ of the second overtone mode of vibration of the amplification circuit and a series resistance $R_2$ of the second overtone mode of vibration thereof.

30. A method according to claim 27; wherein the width of at least one of the grooves represented by $W_2$ is within a range of 0.03 mm to 0.12 mm; and wherein a ratio $W_2/W$ is grater than 0.35 and less than 1, where W represents a width of each of the tuning fork tines.

31. A method according to claim 27; wherein a length of at least one of the grooves is within a range of 40% to 80% of a length of each of the tuning fork tines.

32. A method according to claim 27; wherein the step of forming the quartz crystal tuning fork resonator further comprises the step of forming a third electrode disposed between an outer edge of one of the grooves and an outer edge of the corresponding tuning fork tine; and wherein at least one of the first electrodes is connected to the third electrode.

33. A method according to claim 29; wherein the quartz crystal tuning fork tines are formed before the groove is formed.

34. A method according to claim 29; wherein the groove is formed before the quartz crystal tuning fork tines are formed.

35. A method according to claim 30; wherein the quartz crystal tuning fork resonator has a fundamental mode of vibration and a second overtone mode of vibration, and a merit value $M_2$ for the second overtone mode of vibration of the quartz crystal tuning fork resonator is less than 30 so that the second overtone mode of vibration thereof is suppressed, the merit value $M_2$ being defined by a ratio $Q_2/r_2$ where $Q_2$ and $r_2$ represent a quality factor and a capacitance ratio, respectively, of the quartz crystal tuning fork resonator capable of vibrating in the second overtone mode.

36. A method according to claim 31; wherein a merit value $M_1$ for a fundamental mode of vibration of the quartz crystal tuning fork resonator is greater than 65 so that a high frequency stability for the fundamental mode of vibration is obtained, where the merit value $M_1$ is defined by a ratio $Q_1/r_1$ where $Q_1$ and $r_1$ represent a quality factor and a capacitance ratio, respectively, of the quartz crystal tuning fork resonator capable of vibrating in the fundamental mode.

37. A method according to claim 35; further comprising the steps of adjusting an oscillation frequency of the quartz crystal tuning fork resonator prior to the mounting step so that the oscillation frequency is about 32.768 kHz with a frequency deviation within the range of $-9000$ PPM to $+5000$ PPM, and adjusting the oscillation frequency of the quartz crystal tuning fork resonator after the mounting step so that the oscillation frequency is about 32.768 kHz with a frequency deviation within the range of $-100$ PPM to $+100$ PPM.

38. A method according to claim 35; wherein the amplification circuit and the quartz crystal tuning fork resonator constitute a quartz crystal oscillating circuit of the quartz crystal oscillator for outputting through a buffer circuit an output signal having an oscillation frequency of about 32.768 kHz with a frequency deviation within the range of $-100$ PPM to $+100$ PPM.

39. A method according to claim 35; wherein the etching steps are performed simultaneously to form the quartz crystal tuning fork tines and the grooves at the same time.

40. A method according to claim 35; wherein the step of forming the grooves comprises the step of forming each of the grooves in the central linear portion of each of the first and second main surfaces of each of the quartz crystal tuning fork tines so that the grooves on the first and second main surfaces of each of the quartz crystal tuning fork tines form a through-hole extending from the first main surface to the second main surface.

41. A method for manufacturing a quartz crystal tuning fork resonator capable of vibrating in a flexural mode, comprising the steps of:

etching a quartz crystal wafer in a first etching process to form a quartz crystal tuning fork base and a plurality of quartz crystal tuning fork tines connected to the quartz crystal tuning fork base;

etching the quartz crystal wafer in a second etching process different from the first etching process to form a groove having stepped portions in at least one of opposite main surfaces of each of the quartz crystal tuning fork tines;

disposing a plurality of first electrodes having a first electrical polarity on the stepped portions of the grooves of respective ones of the quartz crystal tuning fork tines; and disposing a plurality of second electrodes having a second electrical polarity on side surfaces of respective ones of the quartz crystal tuning fork tines, the second electrical polarity being opposite to the first electrical polarity.

\* \* \* \* \*